United States Patent [19]

Politycki et al.

[11] 4,258,658

[45] Mar. 31, 1981

[54] CVD COATING DEVICE FOR SMALL PARTS

[75] Inventors: Alfred Politycki, Ottobrunn; Konrad Hieber; Manfred Stolz, both of Munich, all of Fed. Rep. of Germany

[73] Assignee: Siemens Aktiengesellschaft, Berlin & Munich, Fed. Rep. of Germany

[21] Appl. No.: 87,886

[22] Filed: Oct. 24, 1979

[30] Foreign Application Priority Data

Nov. 13, 1978 [DE] Fed. Rep. of Germany ....... 2849240

[51] Int. Cl.³ .............................................. C23C 11/14
[52] U.S. Cl. .................... 118/719; 118/724; 118/729
[58] Field of Search ................ 118/715, 719–726, 118/728–733, 900; 427/50, 69, 70, 78, 85, 86, 87, 91, 99, 107, 109, 248.1–255.7; 148/1 NQ; 156/1 NQ

[56] References Cited

U.S. PATENT DOCUMENTS

| 1,601,931 | 10/1926 | Van Arkel | 118/725 X |
| 3,213,827 | 10/1965 | Jenkin | 118/725 |
| 3,408,982 | 11/1968 | Capita | 118/730 |
| 3,456,616 | 7/1969 | Gleim et al. | 118/725 |
| 3,492,969 | 2/1970 | Emeis | 118/715 |
| 3,493,220 | 2/1970 | Kagdis et al. | 118/729 X |
| 3,796,182 | 3/1974 | Rosler | 118/725 |
| 4,018,184 | 4/1977 | Nagasawa et al. | 118/715 |
| 4,048,954 | 9/1977 | Politycki et al. | 118/715 |
| 4,116,161 | 9/1978 | Steube | 118/730 X |
| 4,140,078 | 2/1979 | Wilmanns | 118/720 X |

FOREIGN PATENT DOCUMENTS

| 907164 | 10/1962 | United Kingdom | 118/715 |
| 1199531 | 7/1970 | United Kingdom | 118/730 |

OTHER PUBLICATIONS

*IBM Technical Disclosure Bulletin*, vol. 9, No. 5 [Oct. 1966]Hornberger, "Producing Epitaxial Germanium Deposits", pp. 538–539.
*IBM Technical Disclosure Bulletin*, vol. 21, No. 7 [Dec. 1978], pp. 3016–3018, Brewer et al., "Apparatus for Depositing Thin Films".

*Primary Examiner*—Morris Kaplan
*Attorney, Agent, or Firm*—Hill, Van Santen, Steadman, Chiara & Simpson

[57] ABSTRACT

An apparatus useful for the chemical vapor deposition treatment of small parts is provided. The articles to be treated are received upon a frame and the CVD treatment is carried out within a heated receptor, with the deposition material feed line movable for more uniform coating. Immediately subsequent to the CVD treatment, the coating may be hardened by removing the supporting frame from the still hot receptor by attaching the frame to the movable material feed line. The small parts are now able to be rapidly quenched in freely circulating cooling air.

7 Claims, 1 Drawing Figure

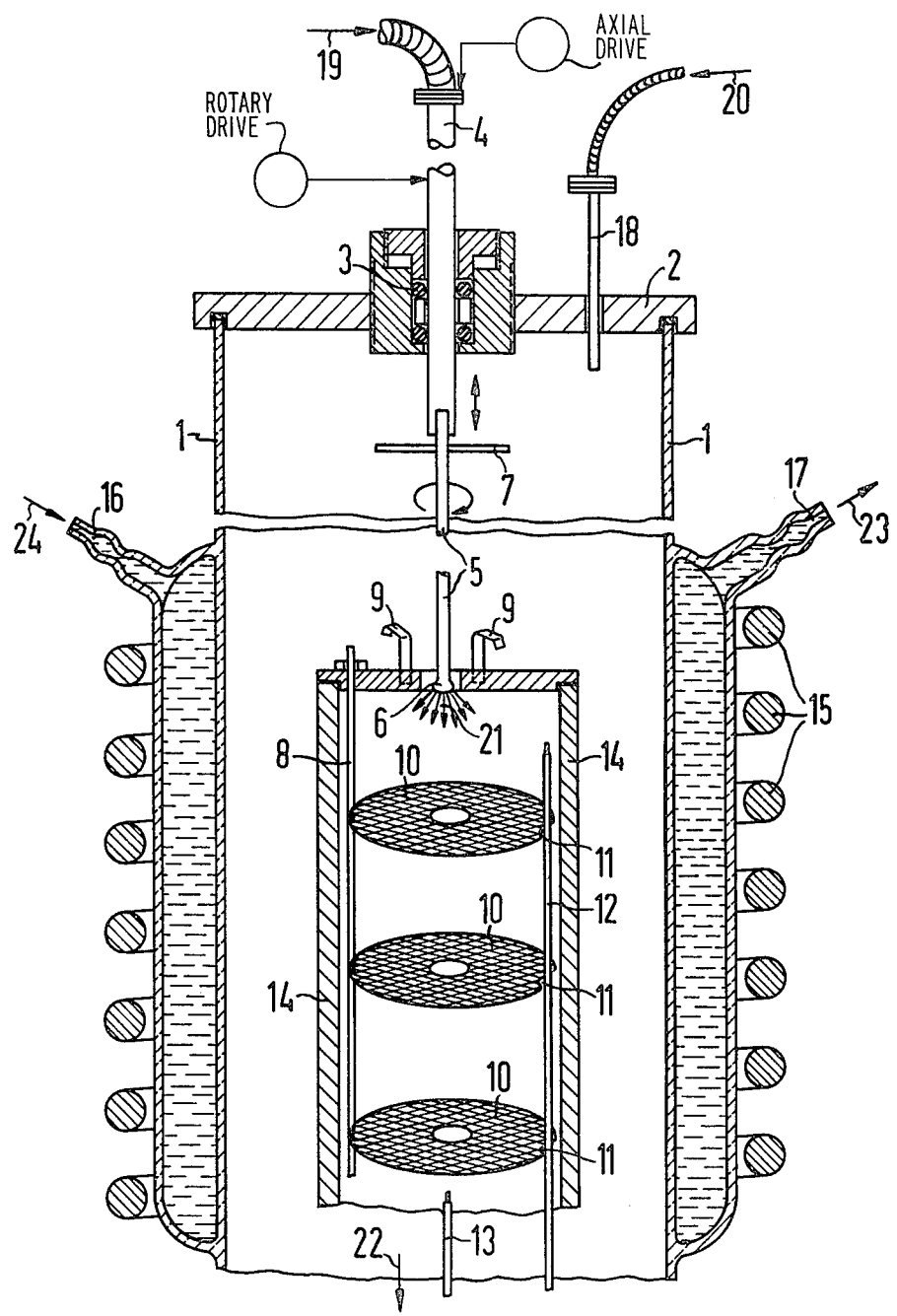

CVD COATING DEVICE FOR SMALL PARTS

BACKGROUND OF THE INVENTION

1. Field of the Invention

The present invlention relates to a device for the chemical vapor deposition coating of small parts, and more particularly to such a device permitting the simultaneous treatment of several small parts and which consists of a reactor with a receptor arranged therein; the receptor having a support fram to receive the parts to be coated and being brought to incandescence by an induction coil.

2. Description of the Prior Art

In the coating of work pieces by means of chemical reactions from the gaseous phase, known as chemical vapor depositin, (CVD), devices similar to applicants' are known from the periodical "Metalloberfläche" 30 (1976) 10, page 474, FIG. 1, as well as from VDI-Zeitschrift 114 (1972), page 1222, FIG. 3. However, the reproducibility of the coating characteristics with respect to coating thickness, roughness, adhesion, and hardness of the applied coatings is foten insufficient despite comparable reaction conditions.

Experimentation has revealed three disruptice affects to uniform, reproducible coats:

(1) The layers become thinner in the lower or rear part of the reactor;

(2) Turbulence in the gaseous stream containing the coating or precipitation material causes localized differences in concentration and temperature; and (3) Intermediate products of the vapor deposition which precipitate on the walls of the reactor can influence the course of the reaction by occasionally causing uncontrollable catalytic effects or, when inductive heating is used, may cause flash-overs.

The deficiencies cited under numbers (1) and (2) can be eliminated by either significantly reducing the gas pressure or by shortening the annealing distance. However either one of these solutions results in a significant reduction of the yield. The problem discussed in (3) has had no solution, until the present invlention as disclosed by applicants herein.

A further disadvantage of the known CVD systems occurs in conjunction with the hardening process, which process is frequently required after the coating of the work pieces. A process where the parts are quenched from the incandescent state using a cold gas stream cannot be optimally carried out in known coating systems because the systems' parts retain heat to such an extent that the cooling process cannot ensue quickly enough. It is therefore necessary to add an additional work step outside of the reactor in which the parts are again annealed and then hardened in a traditional manner.

SUMMARY OF THE INVENTION

The present invention has the underlying objective to avoid the disadvantages described and to have a CVD reactor which allows the integration of the hardening process into the reactor system.

Resolution of these objectives is attained by a device which is characterized by the following inventive features:

(a) The reactor is a double-wall design, (b) The gas introduction line leads into the reactor from the top with a height adjustable and rotatable design, (c) At least two thermal sensors for controlling the temperature are arranged adjacent to the work prices, and (d) An additional gas feed is provided for the introduction of cleansing and/or cooling gas into the reactor.

In a further development of the inventive idea, it is provided that the gas introduction line which is designed so as to be rotatable and displaceable, also be equipped with a quartz distributor jet.

In order to avoid a premature reaction of the gases within the jet, it has proven to be advantageous to provide the gas introduction line with a cooling apparatus. Additionally, the movement of the gas introduction line preferably ensues via a motor drive.

In order to optimally design the quenching effect, the gas introduction line is coupled, via a suspension device, with the support frame of the receptor and is axially displaceable jointly with the support frame. In the uncoupled state, the gas line is designed so as to be moveable in an axial direction relative to the support frame.

It also lies within the framework of the invention to exercise a degree of temperature control, for example to connect the reactor, designed as a double-wall tube, either to a coolant circulation or, to avoid the precipitation of disruptive condensates during the coating, to thermostatically regulate it with heated oil.

Various other objects, advantages, and features of the present invention will become readily apparent from the ensuing detailed description and drawing, with the novel features particularly pointed out in the appended claims.

BRIEF DESCRIPTION OF THE DRAWING

The FIGURE is a schematic, cross-section showing an embodiment of the invention in elevation.

DESCRIPTION OF THE PREFERRED EMBODIMENTS

The FIGURE shows a reactor 1, constructed out of quartz, with a cover plate 2 closing its top end. The cover plate 2, typically steel, has an axially displaceable gas feed line 4 conducted therethrough with shaft seal chambers 3 providing a vacuum-tight seal. The gas feed line 4 continues onto a gas introduction pipe 5 at its lower end which in turn discharges into a quartz distributor jet 6. A support 7 for the hooks 9 which are attached to the support fram 8 is situated at the upper end of the gas inroduction pipe 5.

The support frame 8 contains plate-like trays 10, which cnsist of metal meshes for receiving the parts to be coated. The trays 10 are attached to the support frame 8 and are parallel to one another, with recesses 11 at their outer edge to receive a thermal sensor 12 running vertically along the edges of said trays 10. The thermal sensor 12 allows for precise temperature control within the reaction space in the area below the gas distributor jet 6. An additional thermal sensor 13 under the lowest tray 10 allows for temperature control in the lower portions of the support frame 8.

The support frame 8 is surrounded by receptor 14 which is heated via the induction heating coil 15 surrounding the reactor 1. The reactor 1 has a double-wall design in the area adjacent to the coil 15 to permit the circulation of a coolant, typically cooling water, or heated oil, after connection with nozzles 16 and 17, and thereby gain additional temperature regulation. The heated oil can be utilized where there is a problem of condensate precipitating out of the reaction gas onto the inner reactor wall.

During the coating process, the support fram 8 and trays 10 are surrounded by the receptor 14 and heated to the deposition temperature. The gas introduction tube 5 with the distributor jet 6 is brought into an optimum position with respect to the parts to be coated by means of pushing the distributor jet 6 further into the reactor, pushing it back and forth, or turning it. Localized temperature changes are displayed immediately by means of the two thermal elements 12 and 13, whereby conclusions concerning an altered gas stream are possible.

When the coating process is terminated, the so-called hardening process ensures. This requires the parts which are in the incandescent state to be quickly removed from the oven area and quenched by means of a cold, gaseous stream. To this end, the gas introduction line 4, which is connected with the support frame 8 and trays 10 via the support 7 and the hooks 9, is withdrawn toward the top by means of a motor drive actuated from the outside, whereby the coated parts are pulled from the area of the hot receptor 14. The coated parts may then be more effectively subjected to a cold cleansing gas, for example, hydrogen, streaming in through the gas lead 18. At the same time, the reactor 1 is connected to the cooling water circulatin and the coil heat is switched off.

The arrows 19, 20, 21 and 22 indicated in the FIGURE mark the gas stream flow. The flow of the coolant or heated oil is marked by arrows 23 and 24. The double arrow and the rotary arrow are meant to indicate the axial displacement or, respectively, rotation of the gas lines 4 and 5, and the gas jet 6.

The apparatus has proven itself for coating the chuck elements used in dental drills or, the dental drill turbines with wear-reducing coatings. In coating with titanium carbide and titanium nitride, (a layer thickness of approximately 5 μm), the serviceable life of the sampling batch was improved by a factor of 3 in comparison to uncoated reference samples.

Other carbides and nitrides as well as oxides or metallic raw materials can also be deposited according to the CVD process. By way of example, tantalum coats have proven themselves to be excellent protection against corrosion. When used in such cases, the layer thicknesses lie at approximately 30 μm.

While we have disclosed an exemplary structure to illustrate the principles of the invention, it should be understood that we wish to embody within the scope of the patent warranted hereon, all such modifications as may reasonably and properly come within the scope of our contribution to the art.

We claim as our invention:

1. An apparatus for the simultaneous chemical vapor deposition treatment of small parts which comprises:
    a support frame able to retain small parts for treatment;
    a receptor chamber vertically surrounding and receiving said support frame and having a removable lid portion nesting thereon and attached to said support frame;
    a reactor able to receive and surround said receptor and having double outer walls forming an enclosed jacket for said reactor;
    an induction coil surrounding and adjacent to said reactor for heating said receptor;
    a cover plate having at least two throughbores and being received by the top portion of said reactor;
    a gas feed line inserted through one throughbore of said cover plate, forming a vacuum-tight seal therewith, terminating within said reactor with means for both axial and rotational movement within said reactor and communicating with said receptor chamber through an aperture in the removable lid thereof;
    at least one cooling and cleansing gas lead line inserted and sealed in a separate throughbore of said cover plate;
    at least two thermal elements placed within said receptor and in close proximity to said support frame, having means for remotely indicating the ambient temperature of said support frame; a support means attached to a portion of said gas feed line lying within said reactor; and a coupling device attached to the removable lid portion of said receptor, able to be received upon and coupled with said support means, whereby the removable lid portion and attached support frame may be withdrawn from said receptor by axial movement of the gas feed line when the coupling device is coupled with said support means.

2. An apparatus for the simultaneous chemical vapor deposition treatment of small parts as described in claim 1 and further comprising;
    a distributor jet attached to the end of said gas feed line, lying within said reactor.

3. An apparatus for the simultaneous chemical vapor deposition treatment of small parts as described in claim 2 wherein said distributor jet is constructed out of quartz.

4. An apparatus for the simultaneous chemical vapor deposition treatment of small parts as described in claim 1 wherein the means for axial and rotational movement of said gas feed line comprises motor drive means.

5. An apparatus for the simultaneous chemical vapor deposition treatment of small parts as described in claim 1 and further comprising: means associated with the double-walled portion of the reator for heating or cooling said reactor.

6. An apparatus for the simultaneous chemical vapor deposition treatment of small parts as described in claim 5 wherein the means associated with the double-walled portion are connections for the reception, circulation and discharge of either cooling water or heated oil.

7. An apparatus for the simultaneous chemical vapor deposition treatment of small parts as described in claim 1 and further comprising:
    a plurality of parallel trays attached to said support frame, whereby the small parts to be treated may be received thereon.

* * * * *